United States Patent
Lakkis

(10) Patent No.: US 6,694,131 B1
(45) Date of Patent: Feb. 17, 2004

(54) METHOD AND APPARATUS FOR ADAPTIVE IMAGE REJECTION

(75) Inventor: Ismail Adnan Lakkis, San Diego, CA (US)

(73) Assignee: Mitsubishi Electric Corporation, Amagasaki (JP)

( * ) Notice: Subject to any disclaimer, the term of this patent is extended or adjusted under 35 U.S.C. 154(b) by 0 days.

(21) Appl. No.: 09/790,360

(22) Filed: Feb. 21, 2001

(51) Int. Cl.[7] ................................................ H04B 1/10
(52) U.S. Cl. ..................................... 455/302; 455/192.1
(58) Field of Search ............................... 455/302, 303, 455/324, 255–259, 265, 192.1, 192.2, 232, 334, 318; 375/344

(56) References Cited

U.S. PATENT DOCUMENTS

| | | | |
|---|---|---|---|
| 4,352,208 A | 9/1982 | Schroeder | |
| 4,944,025 A | 7/1990 | Gehring et al. | |
| 5,003,621 A | * 3/1991 | Gailus | 455/209 |
| 5,155,862 A | 10/1992 | Hansen | |
| 5,339,455 A | 8/1994 | Vogt et al. | |
| 5,438,692 A | 8/1995 | Mohindra | |
| 5,440,587 A | * 8/1995 | Ishikawa et al. | 455/332 |
| 5,619,531 A | * 4/1997 | Taylor et al. | 375/222 |
| 5,668,839 A | * 9/1997 | Bernasconi et al. | 375/347 |
| 5,802,463 A | * 9/1998 | Zuckerman | 455/208 |
| 5,918,167 A | 6/1999 | Tiller et al. | |
| 5,949,832 A | 9/1999 | Liebetreu et al. | |
| 5,987,075 A | * 11/1999 | Abe et al. | 375/334 |
| 6,009,126 A | 12/1999 | Van Bezooijen | |

* cited by examiner

Primary Examiner—William Trost
Assistant Examiner—Nghi Ly
(74) Attorney, Agent, or Firm—Oblon, Spivak, McClelland, McClelland, Maier & Neustadt, P.C.

(57) ABSTRACT

Adaptive image rejection in a wireless communication receiver is implemented using a dual conversion technique where a first mixer is used to downconvert the received RF signal to a first IF. A second mixer is used to downconvert the first IF to a baseband signal. A Local Oscillator (LO) drives the first mixer. The baseband signal is filtered and data is extracted. A bit error rate is determined from the extracted data. If the bit error rate falls below a predetermined threshold, a controller adjusts the frequency of the LO. If the LO was previously configured as a low side LO the controller adjusts the frequency of the LO to a high side LO frequency. Conversely, if the LO is configured as a high side LO the controller adjusts the frequency of the LO to be the low side LO frequency.

21 Claims, 7 Drawing Sheets

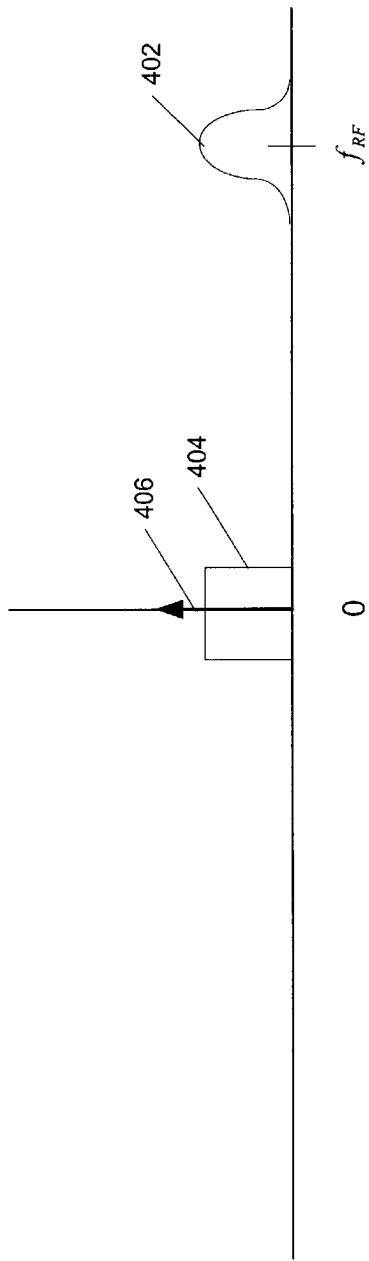
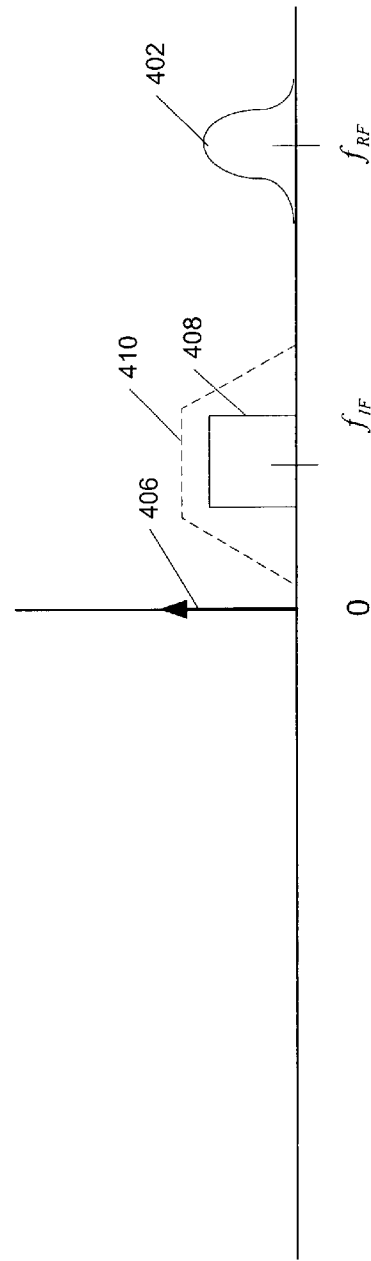

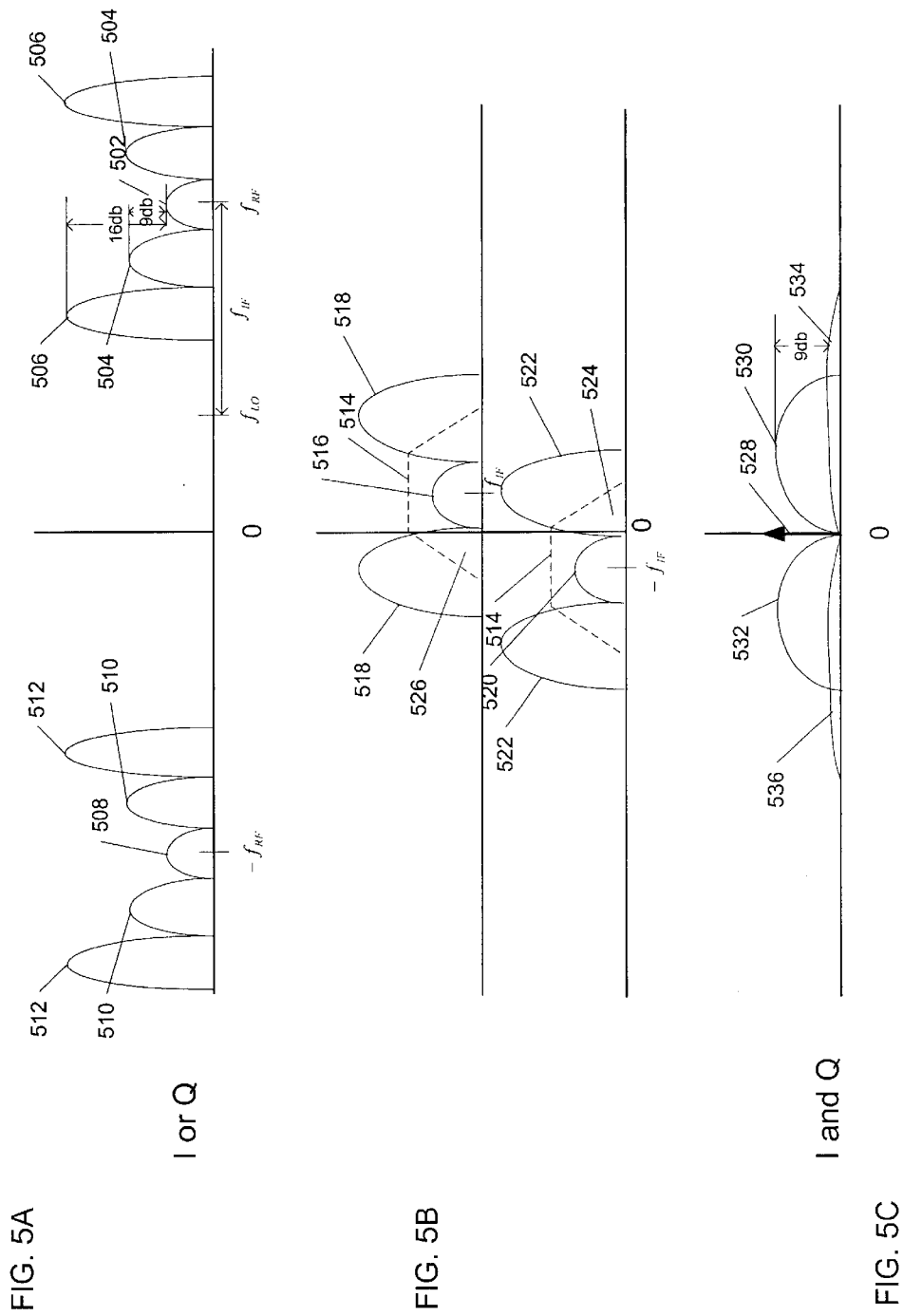

METHOD AND APPARATUS FOR ADAPTIVE IMAGE REJECTION

FIELD OF THE INVENTION

The present invention relates generally to wireless communication devices and, more particularly, relates to adaptive image rejection.

BACKGROUND OF THE INVENTION

Wireless communication systems are an integral component of the ongoing technology revolution. In fact, mobile radio communication systems, such as cellular telephone systems, are evolving at an exponential rate. In a cellular system, a coverage area is divided into a plurality of "cells." A cell is the coverage area of a base station or transmitter. Low power transmitters are utilized, so that frequencies used in one cell can also be used in cells that are sufficiently distant to avoid interference. Hence, a cellular telephone user, whether mired in traffic gridlock or attending a meeting, can transmit and receive phone calls so long as the user is within a "cell" served by a base station.

One implementation of a cellular network 100 is depicted in block form in FIG. 1. The network 100 is divided into four interconnected components or subsystems: a Mobile Station (MS) 106, a Base Station Subsystem (BSS) 102, a Network Switching Subsystem (NSS) 104, and an Operation Support Subsystem (OSS) 118. Generally, MS 106 is the mobile equipment or phone carried by the user. And BSS 102 interfaces with multiple mobiles to manage the radio transmission paths between the mobiles and network subsystem. In turn, NSS104 manages system-switching functions and facilitates communications with other networks such as the PSTN and the ISDN. The OSS 118 facilitates operation and maintenance of the network.

MS's 106 communicate with BSS 102 across a standardized radio air interface 108. BSS 102 is comprised of multiple base transceiver stations (BTS) 110 and base station controllers (BSC) 114. A BTS 110 is usually in the center of a cell and consists of one or more radio transceivers with an antenna. It establishes radio links and handles radio communications over the air interface with MS's 106 within the cell. The transmitting power of the transceiver defines the size of the cell. Each BSC 102 manages transceivers. The total number of transceivers per a particular controller could be in the hundreds. The transceiver-controller communication is over a standardized "Abis" interface 112. BSC 102 allocates and manages radio channels and controls handovers of calls between its transceivers.

BSC 102, in turn, communicate with NSS 104 over a standardized interface 116. For example, in a GSM system, which will be discussed infra, the interface uses an SS7 protocol and allows use of base stations and switching equipment made by different manufacturers. A Mobile Switching Center (MSC) 122 is the primary component of NSS 104. MSC 122 manages communications between mobile subscribers and between mobile subscribers and public networks 130. Examples of public networks 130 that the mobile switching center may interface with include Integrated Services Digital Network (ISDN) 132, Public Switched Telephone Network (PSTN) 134, Public Land Mobile Network (PLMN) 136, and Packet Switched Public Data Network (PSPDN) 138.

MSC 122 typically will interface with several databases to manage communication and switching functions. For example, MSC 122 may interface with Home Location Register (HLR) 124 that contains details on each subscriber residing within the area served by the mobile switching center. There may also be a Visitor Location Register (VLR) 126 that temporarily stores data about roaming subscribers within a coverage area of a particular mobile switching center. An Equipment Identity Register (EIR) 120 that contains a list of mobile equipment may also be included. Further, equipment that has been reported as lost or stolen may be stored on a separate list of invalid equipment that allows identification of subscribers attempting to use such equipment. Finally, there may be an Authorization Center (AuC) 128 that stores authentication and encryption data and parameters that verify a subscriber's identity.

There are several technologies in use today for different implementations of cellular network 100. When wireless telecommunications began in North America back in the 1950's, an analogue standard called Advanced Mobile Phone Service (AMPS) was used. AMPS operated in the frequency spectrum from 824 to 894 MHz. This spectrum was then divided into 30 kHz channels for use by MS's 106 within cellular network 100. In order to allow full duplex operation, a 30 Khz channel is reserved for each MS 106 to transmit on, and a 30 kHz channel is reserved for each MS 106 to receive on. These two channels are separated within the frequency spectrum by 45 MHz. Thus, a MS 106 transmitting on a channel at 831.21 MHz would receive at 876.21 MHz.

Dividing the frequency spectrum into multiple equally spaced channels is called Frequency Division Multiple Access (FDMA) and is illustrated in FIG. 2A. As can be seen, there is a limited number of channels 202 that can be used within the fixed frequency spectrum from 824 to 894 MHz. As a result, new technologies were developed in order to increase the capacity (number of channels) that could be supported by a cellular network 100. The first of these technologies was called Narrowband Advanced Mobile Phone Service (NAMPS). The key difference between NAMPS and AMPS is the use of a 10 Khz channel in the former. Thus, the capacity in an NAMPS system is three times the capacity of an AMPS system.

Eventually, digital technologies evolved to address the capacity issue and to improve the quality and functionality of the services provided by cellular network 100. The major difference between digital and analogue is the method used to transmit data between MS 106 and BSS 102. In an analogue scheme, the information is encoded as proportional variations in a frequency modulation (FM). In a digital scheme, the information is first digitized and then encoded using various complex modulation schemes. The modulated signal is then transmitted to BSS 102. Additionally, as a result of the digital schemes and the enhanced features they enable, the frequency spectrum from 1.85 GHz to 1.99 GHz has been allocated for new cellular type services called Personal Communications Service (PCS).

The primary digital technologies used in North American are Time Division Multiple Access (TDMA) and Code Division Multiple Access (CDMA). There are several TDMA technologies currently available in the United States. One is the North American-TDMA system (NA-TDMA), also known as Digital-AMPS (D-AMPS). TDMA employs time slots to put multiple calls on the same channel. As illustrated in FIG. 2B, NA-TDMA uses the same channel scheme as AMPS; however, each channel is divided into six time slots 204a–204f. Each slot is then assigned to a different user, thus the capacity of a NA-TDMA system is six times the capacity of an AMPS system and twice the capacity of an NAMPS system. Before 1995, NA-TDMA was governed by the IS-54 standard. IS-54 is being replaced, however, by IS-136, which incorporates implementation in the PCS band, a new Digital Control Channel (DCCH), and new user services.

Another TDMA system that developed in Europe, where a similar transition from analog to digital technologies took place, is the GSM system. GSM has been adopted for use in the United States as PCS1900, which is now offered in the PCS band.

CDMA, on the other hand, is a completely different type of multiple access scheme. In CDMA, channels are not allocated by dividing the spectrum in frequency or time. Instead, a 1.25 MHz channel is used for all users within a cell. The transmission signal is prepared by first digitizing the data and then multiplying the digitized data by a wide-bandwidth pseudo noise code (pn)-sequence. Thus, as illustrated in FIG. 2C, each transmission 206a, 206b, 206c, and 206d appears as noise to all other transmissions. In order to recover the signal at a receiver, each user is given a specific (pn)-sequence that is recognized by that user's MS 106 and BSS 102. Therefore, only transmissions coded using the specific (pn)-sequence are recognized and the rest of the transmissions are regarded as noise.

Regardless of the technology used, wireless handsets necessarily must extract all information received through a wireless communication link. In a wireless handset, a downconversion receiver is used because of the narrow channel bandwidth in relation to the receive center frequency. A downconversion receiver incorporates at least one mixer to downconvert a received radio frequency (RF) signal. Often, receivers are configured as dual conversion receivers where two downconversion stages are used, and at least two mixers are required. One problem that is encountered in downconversion receiver is the existence of an image signal that is a replica of the received RF signal. During downconversion, both the signal and the image are down converted to the same center frequency. Therefore, any noise or interfering signal contained in the image band will also appear in the downconverted signal band. This will decrease the downconverted signal-to-noise ratio, and reduce the probability that all the information received through the wireless communication link will be extracted.

SUMMARY OF THE INVENTION

The presence of an interfering image signal within a downconversion receiver must be dealt with for effective receiver designs. Techniques such as filtering may not provide the required attenuation. Therefore, the present invention is directed toward an apparatus and method for adaptive image rejection. Adaptive image rejection is provided by an adaptive image rejection circuit comprising a first Local Oscillator (LO) operating at a first center frequency and a first mixing stage, with an input coupled to an output of the first LO. The first mixing stage is used for mixing a received RF signal down to a received IF signal. The circuit also includes a second mixing stage for mixing the received IF signal down to a baseband signal and an analog-to-digital (ADC) converter for converting the baseband signal to a digital signal. In one embodiment, the ADC samples the baseband signal at 4 samples per second and inphase digital data is taken directly from the even samples, while quadrature digital data is taken directly from the odd samples.

The adaptive image rejection circuit further includes a bit error rate estimator for estimating the Bit Error Rate (BER) of the digital signal, and a frequency selector for selecting a second center frequency for the operation of the first LO when the BER exceeds a BER threshold. The adaptive selection of the center frequency based on the BER rate allows the circuit to maintain a lower overall BER by reducing the effect of the interfering image signal. In one embodiment, the first center frequency is offset by an intermediate frequency value below a center frequency of the RF signal and the second center frequency is offset by the intermediate frequency value above the center frequency. In a second embodiment, the first center frequency is offset by an intermediate frequency value above a center frequency of the RF signal and the second center frequency is offset by the intermediate frequency value below the center frequency.

There is also provided a wireless communications receiver that incorporates an adaptive image rejection circuit, and a method of adaptive image rejection. Further embodiments and implementations of the invention are also disclosed and are explained in detail below.

BRIEF DESCRIPTION OF THE DRAWINGS

The present invention is described with reference to the accompanying drawings. In the drawings, like reference numbers indicate identical or functionally similar elements.

FIG. 4A is a diagram illustrating the direct conversion of a received RF signal in a single conversion receiver.

FIG. 4B is a diagram illustrating the downconversion of a received RF signal to an IF signal in a dual conversion receiver.

FIG. 5A is a diagram illustrating signal and image bands for a RF signal and adjacent channels.

FIG. 5B is a diagram illustrating the conversion to IF of signal and image bands illustrated in FIG. 5A.

FIG. 5C is a diagram illustrating the resulting signal and after conversion to IF by the circuit illustrated in FIG. 3.

DETAILED DESCRIPTION OF PREFERRED EMBODIMENTS

Figure 1:
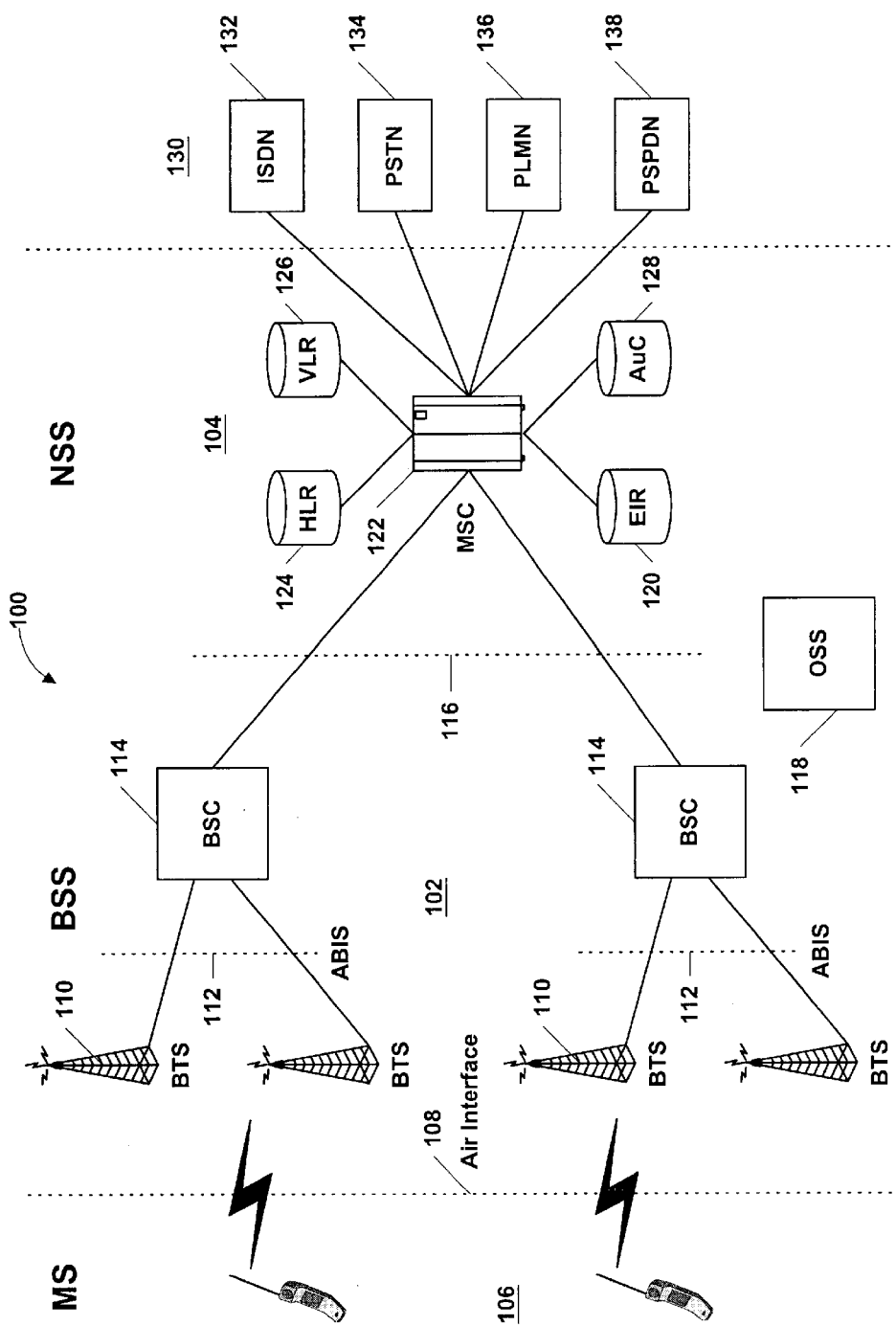
FIG. 1 is a diagram illustrating a typical cellular communications system.
Figure 2:
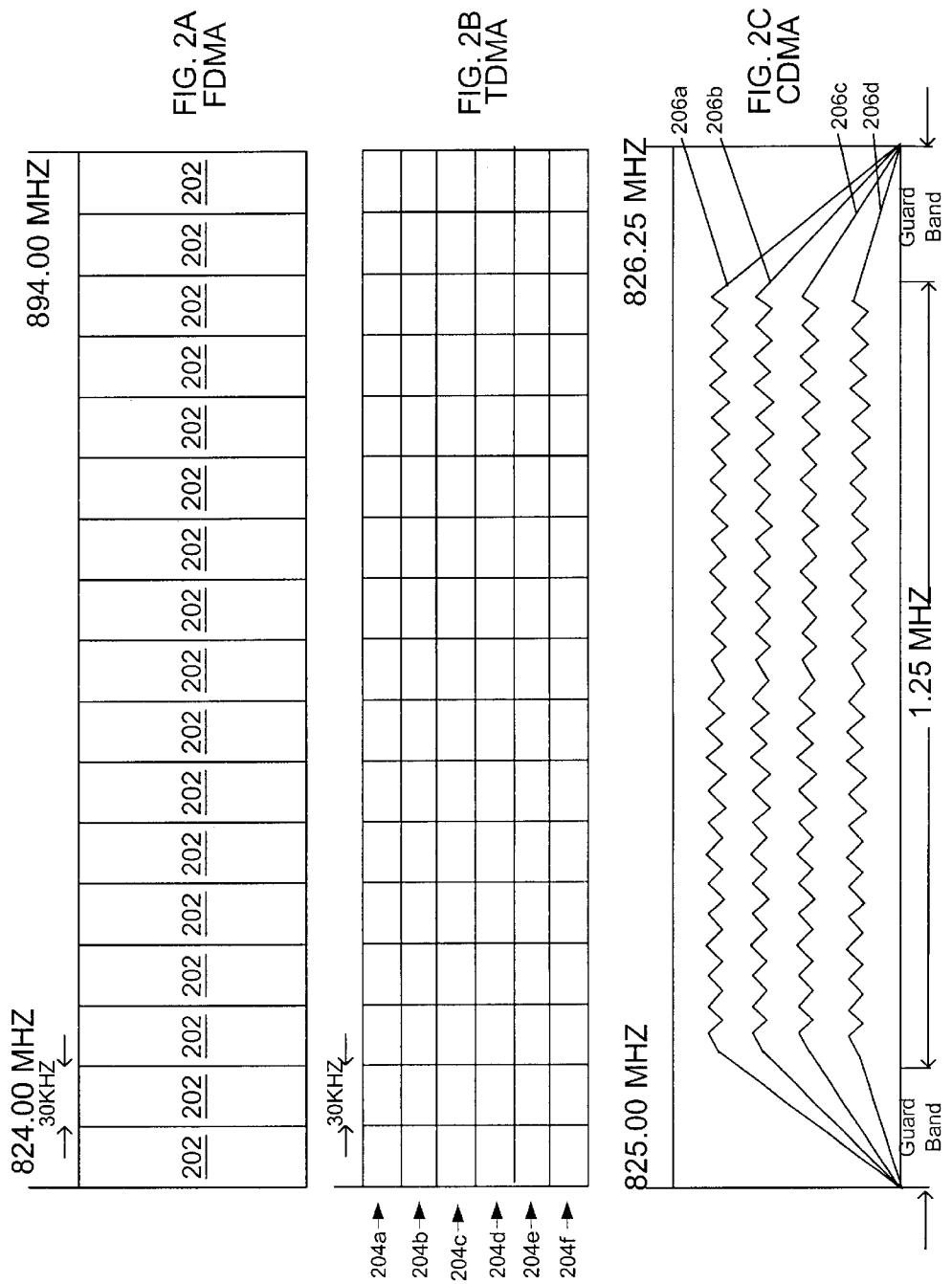
FIG. 2A is a diagram illustrating the channel structure in a FDMA system.
FIG. 2B is a diagram illustrating the channel structure in a TDMA system.
FIG. 2C is a diagram illustrating the channel structure in a CDMA system.
Figure 3:
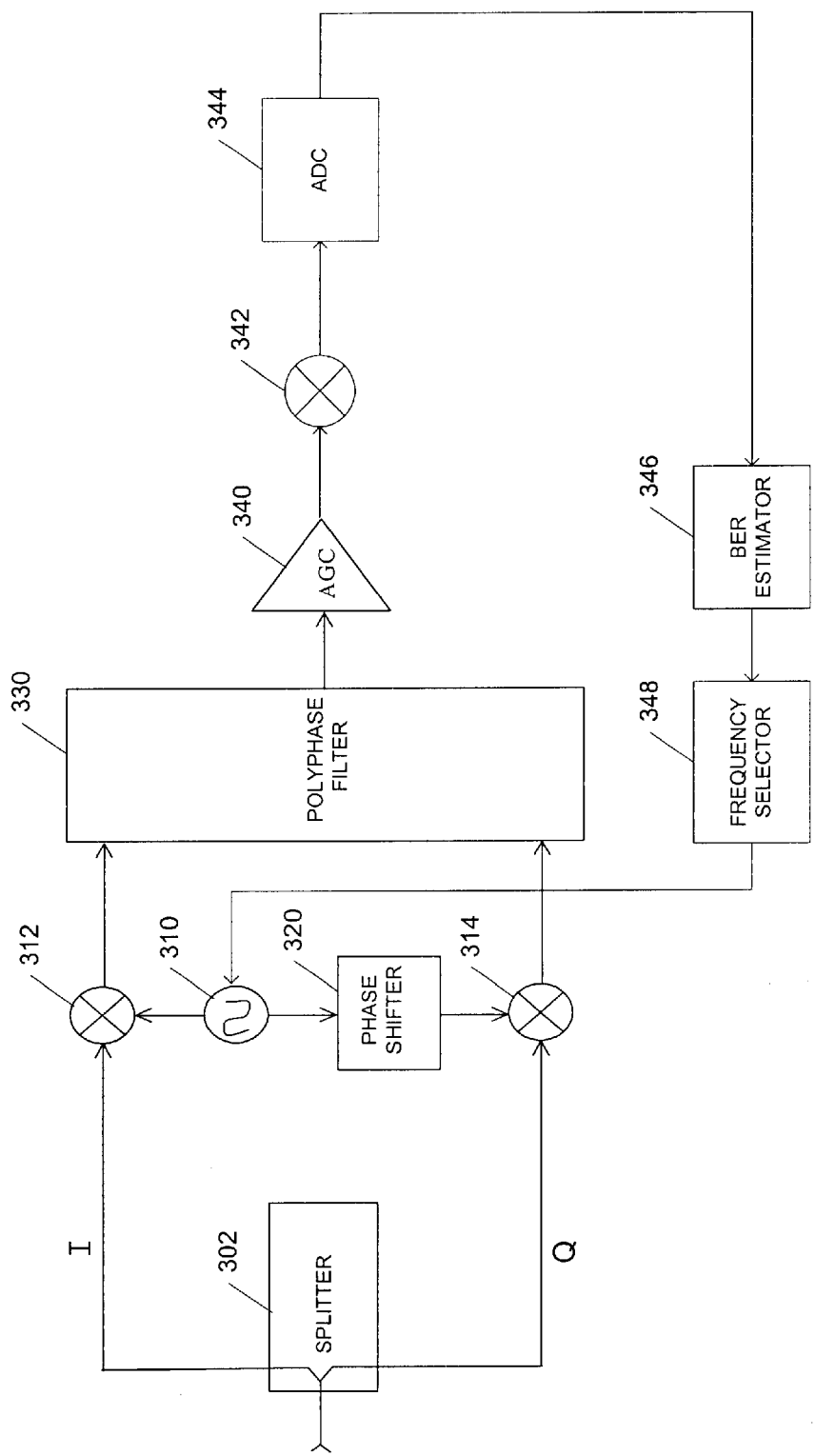
FIG. 3 is a block diagram illustrating an adaptive image rejection circuit in accordance with the invention.

FIG. 3 illustrates an adaptive image rejection circuit 300 in accordance with one embodiment of the claimed invention. In this particular embodiment, circuit 300 is performing Quadrature Phase Shift Keying (QPSK), which is a popular modulation format used in digital wireless phones. QPSK utilizes the simultaneous transmission of two Phase Shift Keying (PSK) signals where one set is in quadrature to the other (shifted in phase by 90 degrees), and two mixers are required in order to recover both the In phase (I) and the Quadrature (Q) signals. A received RF signal is first coupled to a splitter 302 that is used to provide isolation between the I and Q paths and to ensure each path is maintained as a transmission line with a proper termination. Splitter 302 may be eliminated if the combined impedance of mixers 312 and 314 result in a proper terminating impedance; however, signal isolation is lost between the I and Q paths if splitter 302 is eliminated.

Each splitter output is coupled to a mixer. A first signal path is defined as the I signal path and couples one splitter output to a first mixer 312. A second path defined as the Q path couples the second splitter output to a second mixer 314. A single LO 310 drives both first mixer 312 and second mixer 314. However, different phases of LO 310 are used for each of mixers 312 and 314. A phase shifter 320 is used to couple the output of LO 310 to second mixer 314. Phase shifter 320 provides ninety degrees of phase shift so that the LO signal to the second signal path is in quadrature to the LO signal to the first signal path. The quadrature LO signals are used to extract the quadrature signals out of first and second mixers, 312 and 314. In an alternative embodiment, two separate LO's with 90° phase shift between them are used to drive the LO inputs to mixers 312 and 314. This configuration, however, has the drawback of requiring an extra mixer.

The quadrature signals output from mixers 312 and 314 are then coupled in parallel to a polyphase filter 330 that combines the I and Q signals into one single ended signal. Polyphase filter 330 band limits the single ended signal and provides image rejection. Additionally, polyphase filter 330 filters out any DC component in the signal that is present at the output of mixers 312 and 314.

Image rejection can be better understood by analyzing a dual conversion receiver with one signal path and two mixers in series. In a dual conversion receiver, the mixers operate as frequency downconverters by multiplying the received RF signal with a Local Oscillator (LO) signal. The resultant mixer outputs are signals centered at the sum and difference of the RF and LO frequencies. In the first mixer, if the center frequency of the received RF signal is designated ($f_{RF}$) and the frequency of the LO is designated ($f_{LO}$), the mixer output consists of two replicas of the received RF signal. One of the replicas is centered at the sum $|f_{LO}+f_{RF}|$ and the other replica is centered at the difference $|f_{LO}-f_{RF}|$. The replica centered at the sum of the RF and LO is typically filtered out when the mixer is used for downconversion. The remaining replica will be at an Intermediate Frequency ($f_{IF}$), which is centered at the difference frequency $|f_{LO}-f_{RF}|$.

Thus, two different LO frequencies will result in the same IF output from the mixer. In a first configuration, typically known as low side injection, an LO frequency lower than the RF center frequency is used. In the second configuration, typically known as high side injection, the LO frequency is higher than the RF center frequency. The LO frequency is spaced from the RF center frequency by a distance equal to the ($f_{IF}$) in both low side injection and high side injection. For example, if $f_{RF}$ is 2 MHz and $f_{LO}$ is 1 MHz, then $|f_{LO}-f_{RF}|$ will be 1 MHz. Similarly, if $f_{LO}$ is 3 MHz, then the result is still 1 MHz, and ($f_{IF}$) is 1 MHz in both cases.

At the same time, signals at two different RF center frequencies will also downconvert to the same ($f_{IF}$) for any given LO frequency. RF signals centered at ($f_{LO}-f_{IF}$) as well as ($f_{LO}-f_{IF}$) will both downconvert to the same ($f_{IF}$), given the same LO frequency. One of these signals is the desired signal and one is the undesired signal. The undesired RF signal is termed the "image", and the corresponding center frequency is termed the "image frequency". Additionally, the band centered at the image frequency that contains the image signal is termed the "image band." The terms "image," "image frequency," and "image band" are used regardless of whether downconversion is accomplished using high side injection or low side injection. The image is spaced above the desired RF center frequency by ($2 \times f_{IF}$) for high side LO and the image is spaced below the desired RF center frequency by ($2 \times f_{IF}$) for low side LO.

The presence of an image signal presents problems for the receiver designer. This is because out of band RF signals may coincide with the image frequency and the amplitude of out of band RF signals is not readily predictable. Since the image downconverts to the same ($f_{IF}$) as does the desired RF signal, the presence of an image results in degradation of the resulting Intermediate Frequency (IF) signal.

One method of reducing the degradation of the IF signal due to an image signal is to use a specially designed mixer that provides image rejection. Typically, however, these image rejection mixers can only provide approximately 35 dB of image rejection. The desired IF signal must achieve a predetermined Signal-to-Noise Ratio (SNR) in order to satisfactorily recover the information in the received signal. The 35 dB of image rejection from the mixer alone may not be sufficient to achieve the desired IF SNR when the amplitude of the image is equal to, or greater than, the amplitude of the desired RF signal. Therefore, image rejection is an important function of polyphase filter 330. In actuality, polyphase filter acts to filter all out of band signals in the outputs of mixers 312 and 314.

Another important function of polyphase filter 330 is filtering out DC components due to leakage in mixers 312 and 314. Leakage is a primary reason that dual conversion receivers are typically preferred over single conversion or direct conversion receivers. In either a dual or single conversion receiver, the ultimate goal is to convert an RF signal centered at ($f_{RF}$) to a baseband signal, which has a center frequency at DC. The situation for a single conversion receiver is illustrated in FIG. 4A. RF signal 402 is mixed down to baseband signal 404. During the mixing process, however, the LO signal will leak across to the RF signal input of the mixer. For example, LO 310 will leak from the LO input to the I input of mixer 312. Similarly, the inphase signal will leak from that I input to the LO input. These phenomena result in self-mixing of both inputs. Self-mixing creates a DC component 406 in the output of the mixer. As can be seen in FIG. 4A, DC component 406 cannot be filtered out because baseband signal 404 is also at DC. Therefore, DC component 406 degrades the SNR of baseband signal 404, which degrades the performance of a single conversion receiver.

In the dual conversion receiver, RF signal 402 is first mixed to an ($f_{IF}$), creating IF signal 408. A bandpass filter with transfer function 410 can then be used to filter out DC component 406. In FIG. 3, polyphase filter 330 provides this bandpass filtering.

In another embodiment, the bandwidth of polyphase filter 330 is adjustable. In this embodiment, polyphase filter 330 incorporates an input to allow the controller to adjust the bandwidth based on the particular communication standard being supported. When the receiver is supporting a GSM communication standard, for example, the controller sets the bandwidth of the polyphase filter 330 to be wider than when the receiver is supporting an IS-136 communication standard. The variable bandwidth of the polyphase filter 330 maximizes the baseband signal to noise for each communication standard.

As illustrated in FIG. 3, polyphase filter 330 output is coupled to an AGC amplifier 340. Assuming circuit 300 is a dual conversion receiver, then the output of AGC 340 is coupled to a third mixer 342, which mixes the single-ended IF signal down to a baseband signal. The baseband signal is coupled to an Analog-to-Digital converter (ADC) 344, which converts the baseband signal to a digital signal. The digital signal is coupled to Bit Error Rate (BER) estimator 346. The purpose of BER estimator 346 is to estimate the BER of the digital signal. If the BER exceeds a BER threshold, which is predetermined through testing of circuit 300, then BER estimator 346 signals frequency selector 348. When this occurs, frequency selector 348 commands LO 310 to change from high side injection to low side injection or vice-versa. This adaptive changing of the LO frequency based on the BER of the digital signal is a key to adaptive image rejection performed by circuit 300.

FIGS. 5A–5C show example RF and IF spectra for a receiver incorporating adaptive image rejection. In FIG. 5A, a desired RF signal 502 is centered at ($f_{RF}$). In addition, there will be signals on first adjacent channels 504 and second adjacent channels 506. At the same time, there will be image signals 508, 510, 512 in the image band, centered at (-$f_{RF}$), corresponding to signal 502, first adjacent channels 504, and second adjacent channels 506, respectively. The spectra illustrated in FIG. 5A can represent the spectra for either an inphase signal or a quadrature signal in a quadrature receiver. Therefore, first mixer 312 or second mixer 314 mixes signal 502 with an LO signal centered at ($f_{LO}$), which is a distance ($f_{IF}$) from ($f_{RF}$). It should be noted that this is an example of low side injection, but ($f_{IF}$) could also be ($f_{IF}$) above ($f_{RF}$) for high side injection. The mixing process creates a replica of signal 502, and any adjacent channels 504 and 506 that happen to be within the RF bandwidth, at ($f_{IF}$). Therefore, after mixing there is a replica 516 (FIG. 5B) of signal 502 at ($f_{IF}$) and in addition there are adjacent channel replicas 518 corresponding, for example, to first adjacent channels 504. There can also be replicas of second adjacent channels, or even third, fourth, etc., however, the first adjacent channel replicas 518 are the most relevant to the current discussion.

FIG. 5B further illustrates that polyphase filter 330, or any other bandpass filter that follows mixers 312 and 314, filters out signals outside of the filter bandwidth 514. Typically, the narrow band bandpass filtering illustrated in FIG. 5B is performed in the IF stage, because the center frequency is lower than in the RF stage. The lower center frequency results in a lower filter Q, and the lower filter Q makes a sharp filter response more practical to realize. The shape of bandwidth 514 shows that it is not possible for the filter to exhibit an ideal "brick wall" response, however, where only desired replica 516 is passed and all other signals are rejected. Replica 516 is passed through filter bandwidth 514 with no change in shape, while adjacent channel replicas 518 lie only partially within bandwidth 514. As a result, adjacent channel replicas 518 are substantially attenuated, but a significant remnant 526 will remain. There is also a remnant on the opposite side of replica 516, but for this discussion remnant 526 is most relevant.

The amplitude of remnant 526 varies in proportion to the amplitude of the original signal 504. Signal 504 is often quite large relative to signal 502. For example, in a GSM system, the first adjacent channels 504 are 9 dB higher than signal 502, and second adjacent channels 506 are 16 dB higher. Therefore, remnant 526 can have a significant amplitude. The problem is that there will also be an image remnant 524 that corresponds to remnant 526. This is because image 508 will mix down to IF signal 520 along with adjacent channel image replicas 522. FIG. 5B illustrates that image remnant 524 can overlap replica 516, which is the desired IF signal. The interference due to image remnant 524 cannot be filtered out, because it falls within the desired signal 516 bandwidth. Therefore, the SNR of signal 516 is degraded because of the image remnant 524. This will result in a higher BER in the output of ADC 344.

If the BER exceeds a predetermined threshold, a control signal causes frequency selector 348 to command LO 310 to tune to an alternate position above desired IF frequency ($f_{IF}$). Using high side injection results in a frequency inversion of signal 506. In effect, signal 520 is now being used. FIG. 5B illustrates that remnant 526 will still overlap signal 520. But, because the location in terms of frequency, amplitude, and attenuation of all signals illustrated in FIGS. 5A and 5B will vary with the tolerances and signal characteristics involved, it is possible that the adaptive selection of the LO injection will result in a lower overall BER. By toggling between alternative LO positions, the best overall BER is maintained.

It should be noted that in some embodiments, selection of the LO frequency position is done only once, prior to actual use. This way the best position can be determined and fixed prior to actual use, which may save processing overhead during operation. It should be further noted that while the above discussion is illustrated with reference to quadrature I and Q signal paths, those skilled in the art will recognize that other configurations are possible. For example, the RF signal may be single-ended and require one mixer 312 with LO 310. Therefore, the above examples as they relate to quadrature signal paths are by way of example only and are not intended to limit the scope of the invention in any way.

FIG. 5C illustrates I and Q IF signals in a quadrature circuit. Thus, when I and Q are combined, a desired signal 530 and image 532, as well as noise floors 534 and 536 are present. There is also a DC component 528, but this can be filtered out by filter 330. Typically, noise floors 534 and 536 must be below signals 530 and 532 by a specified amount. For example, in a GSM system, noise floors 534 and 536 must be 9 dB below signals 530 and 532, respectively.

In one embodiment, the output of ADC 344 is also in quadrature. In fact, any or all of the signals in circuit 300 can be in quadrature. This obviously requires duplicate components in some instances, which raises the cost, board area, and assembly time of circuit 300 and, therefore, is typically not done for all signals. In an embodiment with quadrature output from ADC 344, the I and Q digital signals can be taken directly from even and odd ADC sample outputs, respectively. For example, in one embodiment, ADC 344 samples the output of LO 342 at a rate of 4 samples per second. The I digital data is then taken from the even samples and the Q digital data is taken from the odd samples. It should be noted that the conditions illustrated in FIG. 5C must be met in order for the I and Q data to be taken directly from the even and odd samples.

Figure 6:
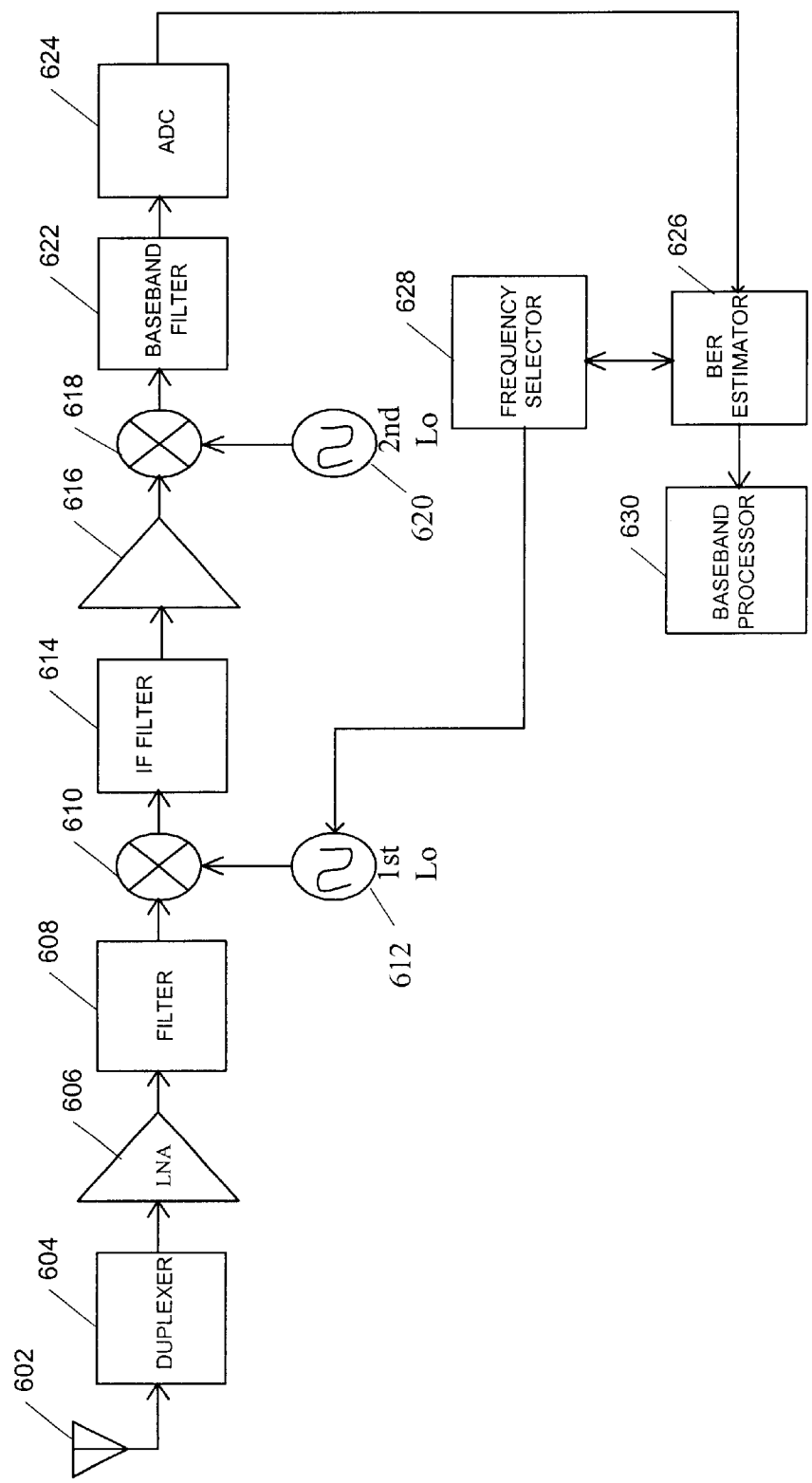
FIG. 6 is a diagram illustrating an embodiment of a wireless receiver that incorporates the circuit of FIG. 3.

FIG. 6 is a block diagram detailing a wireless communication receiver 600. RF received signals are first coupled to antenna 602 and duplexer 604. A Low Noise Amplifier (LNA) 606 is coupled to the receiver output of duplexer 604. LNA 606 amplifies the received signal while contributing a minimal amount of signal degradation. The output of LNA 302 is coupled to a filter 608 that is used to reject frequencies outside of a predetermined bandwidth. Filter 608 is advantageously placed after LNA 606 to minimize signal degradation as a result of filter insertion loss. Placement of filter 608 following the LNA 606, therefore, results in minimal contribution from the filter to the overall receive noise figure. The filtered output is coupled to a first mixer 610. First mixer 610 is used to downconvert the received signal to an IF signal. First mixer 610 uses a first LO 612 in order to accomplish the down conversion. First mixer 610 multiplies the received signal with first LO 612 and the desired mixer output is a duplicate of the received RF signal centered at a frequency equal to the difference of the received RF center frequency and the frequency of first LO 612. The undesired frequency components output from first mixer 610 are rejected in a subsequent IF filter 614. The output of IF filter 614 is coupled to an IF amplifier 616 to increase the amplitude of the IF signal. The output of IF amplifier 616 is coupled to the input of a second, or IF mixer 618. A second LO 620 drives the IF mixer 618. IF mixer 618 can be configured to downconvert the IF signal to a second IF or to baseband. When second mixer 618 is configured to convert the IF to baseband, the output of second mixer 618 is coupled to a baseband filter 622. Baseband filter 622 is used to reject the undesired frequency components generated in the IF mixer 618. Again, however, no filter following a mixer is able to reject an undesired mixer component contributed by an image.

The output of baseband filter 622 is coupled to an ADC 624, where the received information is converted to digital data. The digital data is coupled from the output of ADC 624 to a BER estimator 626, which estimates the BER of the digital data.

The BER value of the digital data is directly related to the signal to noise ratio of the signal. A signal with a low signal to noise ratio will exhibit a high BER. If the BER value exceeds a predetermined threshold the received signal is degraded. The image is the likely contributor to the signal degradation since it is difficult to completely filter out the image signal. BER estimator 626 will command selector 628 to tune the frequency of first LO 612 to an alternative frequency when the BER value exceeds the predetermined threshold. The alternative frequency is that LO frequency that would result in the same desired frequency output from mixer 610. If LO 612 is originally operating as a low side LO, with the LO tuned to a frequency offset below the desired signal, the alternative frequency is that LO frequency that corresponds to a high side LO, where the LO is tuned to a frequency offset above the desired signal. When the second LO changes from a low side LO to a high side LO the desired output frequency remains the same. But, the image frequency changes. The image frequency is below the received signal when low side LO is used, whereas the image frequency is above the received signal when high side LO is used. Thus, the frequency of the image is changed by changing the frequency of the LO. It is unlikely that a signal at the new image frequency is at the same amplitude as the original interfering image. The result of changing the LO frequency is to decrease signal degradation due to the image. Received signal quality is improved by allowing the frequency selector 628 to tune the first LO 612 controller 140 to tune the second LO 332 to the side that results in an acceptable BER.

ADC 624, BER estimator 626, and frequency selector 628 comprise part of an adaptive image rejection circuit such as circuit 300 illustrated in FIG. 3. LO 612, mixer 610, and filter 614 also form a part of the adaptive image rejection circuit. Depending on the embodiment, mixer 610 can comprise dual mixers such as mixers 312 and 314. In this case, a phase shifter 320 would also be required. Additionally, filter 614 can be a polyphase filter such as polyphase filter 330. Baseband processor 630, which encodes and decodes digital data, can include ADC 624, BER estimator 626, or frequency selector 628.

It should be noted that while the examples discussed have generally related to a wireless communications device in a wireless communications system, those skilled in the art will realize that receiver 600 can be included in a variety of systems. For example, receiver 600, or more specifically, circuit 300, can be implemented within cordless phone systems, wireless local loops, or satellite communication systems. As such, the embodiments above, as they relate to a wireless communications system, are by way of example only and are not intended to limit the invention in any way.

Figure 7:
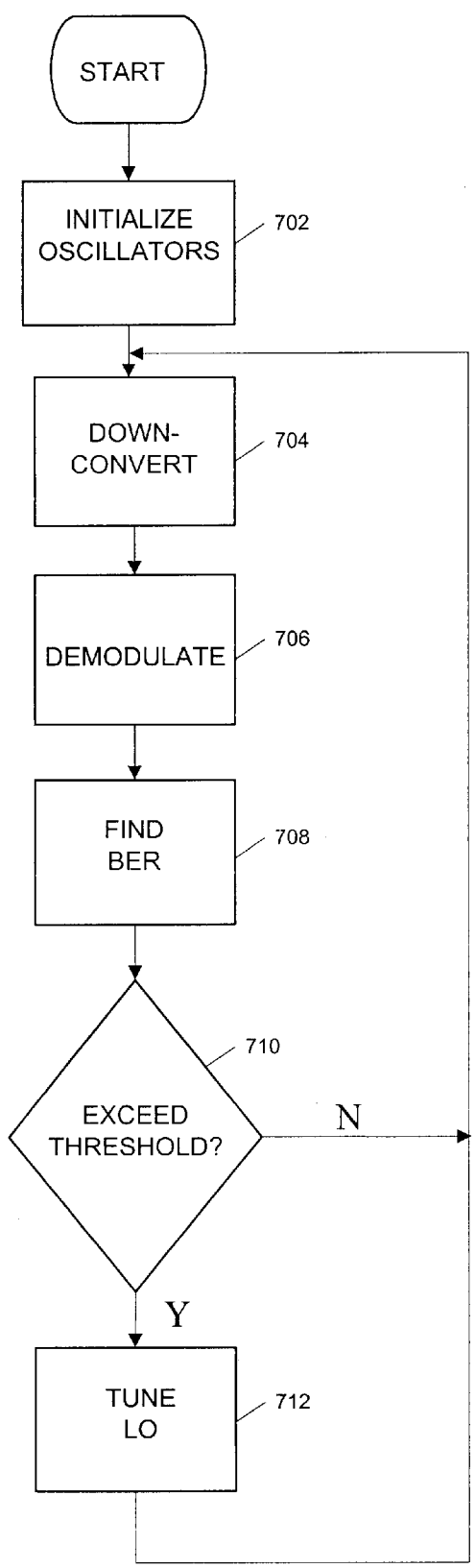
FIG. 7 is a process flow chart illustrating a method of adaptive image rejection in accordance with the invention.

In addition to the above apparatus, FIG. 7 shows a flow chart of a method of adaptive image rejection in a receiver. The routine starts when the wireless device is first powered up or otherwise initialized. The routine initializes the oscillators in step 702. A plurality of devices must be initialized in multiple conversion receivers. The LO used to downconvert the RF signal to an IF signal may be initialized as either a high side LO or a low side LO. Subsequent baseband processing stages must coordinate data recovery with the position of the LO.

Once the oscillators have been initialized the receiver is ready for operation and can downconvert received signals (step 704) from the desired RF channel. The downconverted received signals are then demodulated in step 706 to recover the information contained in the transmission. A baseband processing stage then calculates a Bit Error Rate (BER) value (step 708) of the demodulated data. The calculated BER value is then compared against a predetermined threshold in step 710. If the BER value does not exceed the predetermined threshold the received signal is not degraded due to interfering signals. Therefore, the routine does not change any LO parameters and continues receiving and demodulating the signals. However, if the BER value exceeds the predetermined threshold value, a controller tunes the LO to the alternate position in step 712. The controller tunes the IF LO to the high side location if the LO is presently positioned as a low side LO. Conversely, the controller tunes the LO to the low side location if the LO is currently positioned as a high side LO. The location of the LO toggles from a high side location to a low side location depending on the received BER value. Changing the position of the LO changes the location of any potentially interfering image signals that may appear as high amplitude adjacent channels. Once the controller tunes the LO to the alternate position the receiver continues to receive and downconvert the received signals. The process of receiving, downconverting, and comparing the BER value is repeated using the alternative LO location.

Those skilled in the art will realize the specific receiver illustrated in FIG. 6 is not necessarily required to implement the embodiments and methods discussed. There are numerous variations and adaptations for receiver designs, and the invention and its methods are applicable in any such design that must perform image rejection. For example, while the above examples generally relate to dual conversion receivers, the invention can be implemented in a single conversion receiver as well. Again, the examples provided are by way of illustration only and are not intended to limit the scope of the invention in any way.

I claim:

1. An adaptive image rejection circuit comprising:
  a first Local Oscillator (LO) operating at a first center frequency;
  a first mixing stage, with an input coupled to an output of the first LO, for mixing a received RF signal down to a received IF signal;

a second mixing stage for mixing the received IF signal down to a baseband signal;

an analog-to-digital converter for converting the baseband signal to a digital signal;

a bit error rate estimator for estimating the Bit Error Rate (BER) of the digital signal; and a frequency selector for selecting a second center frequency for the operation of the first LO when the BER exceeds a BER threshold, the second center frequency selected such that the received IF signal is replaced by an image of the received IF signal.

2. The adaptive image rejection circuit of claim 1, wherein the first center frequency is offset by an intermediate frequency value below a center frequency of the RF signal and the second center frequency is offset by the intermediate frequency value above the center frequency.

3. The adaptive image rejection circuit of claim 1, wherein the first center frequency is offset by an intermediate frequency value above a center frequency of the RF signal and the second center frequency is offset by the intermediate frequency value below the center frequency.

4. The adaptive image rejection circuit of claim 1, wherein the received RF signal is a pair of signals in quadrature with each other.

5. The adaptive image rejection circuit of claim 1, wherein the analog-to-digital converter samples the baseband signal at 4 samples per second, and wherein the digital signal produced comprises an inphase digital signal taken from the even samples and a quadrature digital signal taken from the odd samples.

6. The adaptive image rejection circuit of claim 1, further comprising a filter with an input coupled to an output of the first mixing stage for filtering unwanted signal outside of a signal bandwidth associated with the received IF signal.

7. The adaptive image rejection circuit of claim 6, wherein the filter further provides the following functions:

filters out a DC signal in an output of the first mixing stage that is due to leakage in the first mixing stage;

provides image rejection for the output of the first mixing stage; and provides an adjustable signal bandwidth that is based on a communications standard being implemented.

8. The adaptive image rejection circuit of claim 7, wherein the filter also transforms a quadrature output from the first mixing stage into a single-ended output.

9. A method of adaptive image rejection comprising the following steps:

initializing a Local Oscillator (LO) to a first frequency;

downconverting at least one received signal to a baseband signal using the LO;

performing analog-to-digital conversion on the baseband signal to produce a digital signal;

calculating a Bit Error Rate (BER) value of the digital signal;

comparing the BER value to a predetermined threshold; and tuning the LO to an alternative frequency if the BER value exceeds the predetermined threshold, the alternative frequency selected such that the received signal is downconverted to baseband using an image of the received signal.

10. The method of claim 9, wherein the first frequency is offset by an intermediate frequency below a center frequency of the received signal, and the alternative frequency is offset by the intermediate frequency above the center frequency.

11. The method of claim 9, wherein the first frequency is offset by an intermediate frequency above a center frequency of the received signal, and the alternative frequency is offset by the intermediate frequency below the center frequency.

12. A wireless communications receiver, comprising:

a mixer configured to downconvert a received signal using either high side or low side injection of a local oscillator signal;

a bit error rate estimator configured to measure the bit error rate of the downconverted signal; and a frequency controller configure to control generation of the local oscillator signal so as to switch the mixer from high side to low side injection or low side to high side injection if the bit error rate is too high.

13. A wireless communications receiver, comprising:

an antenna for receiving a received RF signal, centered at an RF center frequency;

a band selector for selecting which of a plurality of RF center frequencies to receive;

an adaptive image rejection circuit for producing a digital signal from the received RF signal that maintains a BER below a BER threshold; and a baseband processor for decoding the digital signal, wherein the adaptive image rejection circuit comprises:

a first Local Oscillator (LO) operating at a first center frequency;

a first mixing stage, with an input coupled to an output of the first LO, for mixing a received RF signal down to a received IF signal;

a second mixing stage for mixing the received IF signal down to a baseband signal;

an analog-to-digital converter for converting the baseband signal to a digital signal;

a bit error rate estimator for estimating the Bit Error Rate (BER) of the digital signal; and a frequency selector for selecting a second center frequency for the operation of the first LO when the BER exceeds a BER threshold, the second center frequency selected such that the received IF signal is replaced by an image of the received IF signal.

14. The wireless communications receiver of claim 13, wherein the first center frequency is offset by an intermediate frequency value below a center frequency of the RF signal and the second center frequency is offset by the intermediate frequency value above the center frequency.

15. The wireless communications receiver of claim 13, wherein the first center frequency is offset by an intermediate frequency value above a center frequency of the RF signal and the second center frequency is offset by the intermediate frequency value below the center frequency.

16. The wireless communications receiver of claim 13, wherein the baseband processor comprises at least one of the group comprised of the bit error rate estimator, the analog-to-digital converter, and the frequency selector.

17. A wireless communications receiver, comprising:

an antenna for receiving a received RF signal, centered at an RF center frequency;

a band selector for selecting which of a plurality of RF center frequencies to receive;

an adaptive image rejection circuit for producing a digital signal from the received RF signal that maintains a BER below a BER threshold; and a baseband processor for decoding the digital signal, wherein the adaptive image rejection circuit comprises:
  a first mixer for mixing a received inphase RF signal down to a received inphase IF signal;
  a second mixer for mixing a received quadrature RF signal down to a received quadrature IF signal;
  a phase shifter with an output coupled to an LO input of either the first or second mixer; and
  a first LO operating at a first center frequency with a first output coupled to the LO input of the mixer that is not coupled to the output of the phase shifter, and a second output coupled to an input of the phase shifter;
  a filter for combining the received inphase and quadrature IF signals into a single-ended signal, and for filtering unwanted signals outside of a signal bandwidth associated with the single-ended signal;
  a second mixing stage for mixing the single-ended signal down to a baseband signal;
  an analog-to-digital converter for converting the baseband signal to a digital signal;
  a bit error rate estimator for estimating the BER of the digital signal; and
  a frequency selector for selecting a second center frequency for the operation of the first LO when the BER exceeds a BER threshold, the second center frequency selected such that the single-ended signal is replaced by an image of the single-ended signal.

18. The wireless communications receiver of claim 17, wherein the first center frequency is offset by an intermediate frequency value below a center frequency of the RF signal and the second center frequency is offset by the intermediate frequency value above the center frequency.

19. The wireless communications receiver of claim 17, wherein the first center frequency is offset by an intermediate frequency value above a center frequency of the RF signal and the second center frequency is offset by the intermediate frequency value below the center frequency.

20. The wireless communications receiver of claim 17, wherein the baseband processor comprises at least one of the group comprised of the bit error rate estimator, the analog-to-digital converter, and the frequency selector.

21. The wireless communications receiver of claim 13 included in a mobile station.

* * * * *